United States Patent [19]

Nakajima

[11] Patent Number: 5,331,324

[45] Date of Patent: Jul. 19, 1994

[54] A/D CONVERTER

[75] Inventor: Toyokatsu Nakajima, Hyogo, Japan

[73] Assignee: Mitsubishi Denki Kabushiki Kaisha, Tokyo, Japan

[21] Appl. No.: 21,432

[22] Filed: Feb. 23, 1993

[30] Foreign Application Priority Data

Mar. 6, 1992 [JP] Japan .................... 4-084516

[51] Int. Cl.⁵ ............................................. H03M 1/12
[52] U.S. Cl. ........................................ 341/141; 341/155
[58] Field of Search ................................ 341/141, 155

[56] References Cited

U.S. PATENT DOCUMENTS

| | | | |
|---|---|---|---|
| 4,264,898 | 4/1981 | Barman et al. | 341/141 |
| 4,338,665 | 7/1982 | Aono et al. | 341/118 |
| 5,081,454 | 1/1992 | Campbell, Jr. et al. | 341/141 |
| 5,166,685 | 11/1992 | Campbell, Jr. et al. | 341/141 |
| 5,212,483 | 5/1993 | Wakimoto | 341/141 |

Primary Examiner—Marc S. Hoff
Attorney, Agent, or Firm—Townsend and Townsend Khourie and Crew

[57] ABSTRACT

To accept a plurality of starting factors without the use of a CPU and improve the real-time processing speed of A/D conversion, the same number of channel selection registers, mode registers and conversion result storage registers as the number of starting factors are provided and divided into groups according to the types of starting factors, and a control circuit for specifying a register group for a starting factor when the factor is generated is also provided.

8 Claims, 8 Drawing Sheets

| GROUP NUMBER | NUMBER OF GROUPS | NUMBER OF REPETITIONS |
|---|---|---|

A/D CONVERTER

BACKGROUND OF THE INVENTION

1. Field of the Invention

The present invention relates to an A/D converter for converting analog input signals into digital signals.

2. Description of the Prior Art

FIG. 9 is a block diagram of the configuration of a conventional A/D converter which is commonly used. In the figure, reference numeral G represents a channel selector for selecting one of a plurality of channels having analog input signals 10, 7 a comparator for comparing a changing reference voltage and the voltage of an analog input signal selected by the selector 6, 8 a successive approximation register for storing the comparison result of the comparator sequentially, 3 a conversion result storage register (a 3-word register in this case) for storing the data of the successive approximation register 8 as the result of conversion, 1 a channel selection register for storing channel selection information for the channel selector 6 to select one of the analog input signal channels, 2 a mode register for storing mode information such as starting factors, A/D conversion speed, and A/D conversion operation modes, 9 a D/A converter for converting the data of the successive approximation register 8 into an analog signal to provide this conversion result to the comparator 7 as a reference voltage, 11 a start control circuit for controlling the activation of the A/D converter according to a given starting factor 12, 5 a control circuit for controlling the channel selector 6 according to the outputs of the channel selection register 1, the mode register 2 and the start control circuit 11, and 13 an interrupt request signal outputted from the successive approximation register 8 and supplied to a CPU to inform the completion of conversion.

The operation of the A/D converter will be described hereafter. In advance, channel selection information is set in the channel selection register 1 and mode information is set in the mode register 2. The channel selection register 1 is intended to select an arbitrary analog input signal from a plurality of analog input signals 10. The mode register 2 is intended to determine the operation mode of the A/D converter. Generally, A/D conversion modes include one in which A/D conversion is performed only once after the start of operation, one in which A/D conversion of the same channel of analog input signals into digital signals is repeated, and one in which a plurality of channels having analog input signals are converted into digital signals one after another. As shown in FIG. 9, when there are a plurality of starting factors 12, the mode register 2 is provided with a bit for specifying a starting factor.

Generally speaking, the starting factors are written onto an (unshown) starting register by software, or external events are directly inputted as the starting factors. FIG. 9 shows an example where two starting factors can be selected by the mode register 2.

Therefore, after setting values to the channel selection register 1 and the mode register 2, the A/D converter is activated to begin A/D conversion. A/D conversion of one bit at a time starting from the most significant bit of the analog input signal of a channel selected by the channel selector 6 is performed through comparison of the voltage of the analog input signal and the output (reference voltage) of the D/A converter 9 with the comparator 7, and the result of comparison is stored in the successive approximation register 8. When A/D conversion of all the bits of the analog input signal is completed, the results of conversions are transferred to the conversion result storage register 3 by the unshown CPU.

Since the conventional A/D converter has only one channel selection register, mode register and conversion result storage register, one starting factor must be selected during the system design stage for dedicated use. Therefore, when a plurality of starting factors are required, the CPU must accept the starting factors and the A/D converter must be activated by software. In this way, since the processing of the CPU intervenes in A/D conversion and other processes, response speed to the starting factors is significantly lowered. For example, when such a conventional A/D converter is used in the control system of a car engine, analog information (first starting factor), such as the crank angle (related to the amount of gasoline injection) and engine speed, required on a real-time basis, and analog information (second starting factor), such as the engine coolant temperature, required at predetermined intervals, are converted into digital information through the CPU, thus lowering response speed to the first starting factor in particular.

SUMMARY OF THE INVENTION

The present invention is intended to solve this problem, and it is an object of the present invention to provide an A/D converter which can accept a plurality of starting factors without the use of a CPU and which can improve the real-time processing speed of A/D conversion.

Therefore, the A/D converter according to the present invention claimed in claim 1 comprises the same number of channel selection registers 1A and 1B, mode registers 2A and 2B, and conversion result storage registers 3A and 3B as the number of starting factors when there are a plurality of starting factors, all of which are divided into register groups, each consisting of a channel selection register, a mode register and a conversion result storage register, according to the types of starting factors, and further includes a control circuit 51 for specifying a register group for a certain starting factor when the factor is generated.

The A/D converter according to the present invention claimed in claim 2 further comprises an interrupt request signal generator circuit 113 for generating an interrupt request signal indicative of the completion of A/D conversion for each of the starting factors.

A control circuit 52 in the A/D converter according to the present invention claimed in claim 3 controls a register group selector 44 for determining the weight of a given starting factor and selecting a register group for the factor according to the result of the above-mentioned decision.

In other words, in the present invention claimed in claim 1, when a starting factor is generated and inputted, the control circuit 51 specifies a register group for the starting factor, and the channel selection register, mode register and conversion result storage register of the specified group are used. Therefore, the results of conversions in response to the starting factor are stored in the conversion result storage register.

In the present invention claimed in claim 2, the interrupt request signal generator circuit 113 generates an interrupt request signal indicative of the completion of A/D conversion for each of the starting factors.

In the present invention claimed in claim 3, when a starting factor is generated and inputted, the control circuit 52 determines the weight of the starting factor and controls the register group selector 44 according to the result of this decision, whereby the register group selector 44 selects a register group for the starting factor.

The above and other objects, features and advantages of the invention will become more apparent from the following description when taken into conjunction with the accompanying drawings.

DESCRIPTION OF THE PREFERRED EMBODIMENT

Embodiment 1

Figure 1:
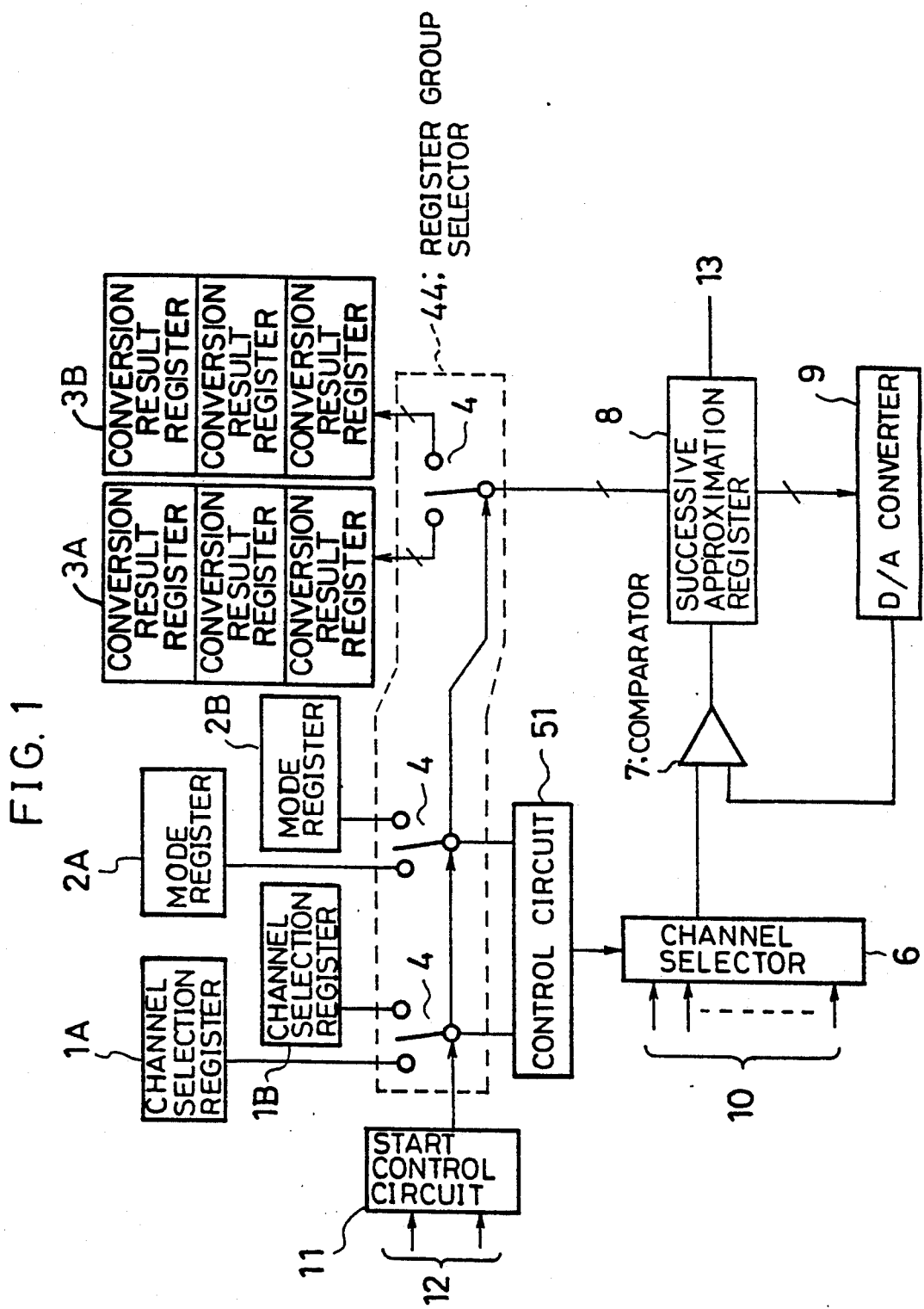
FIG. 1 is a block diagram of the configuration of an A/D converter according to an embodiment of the present invention.
Figure 9:
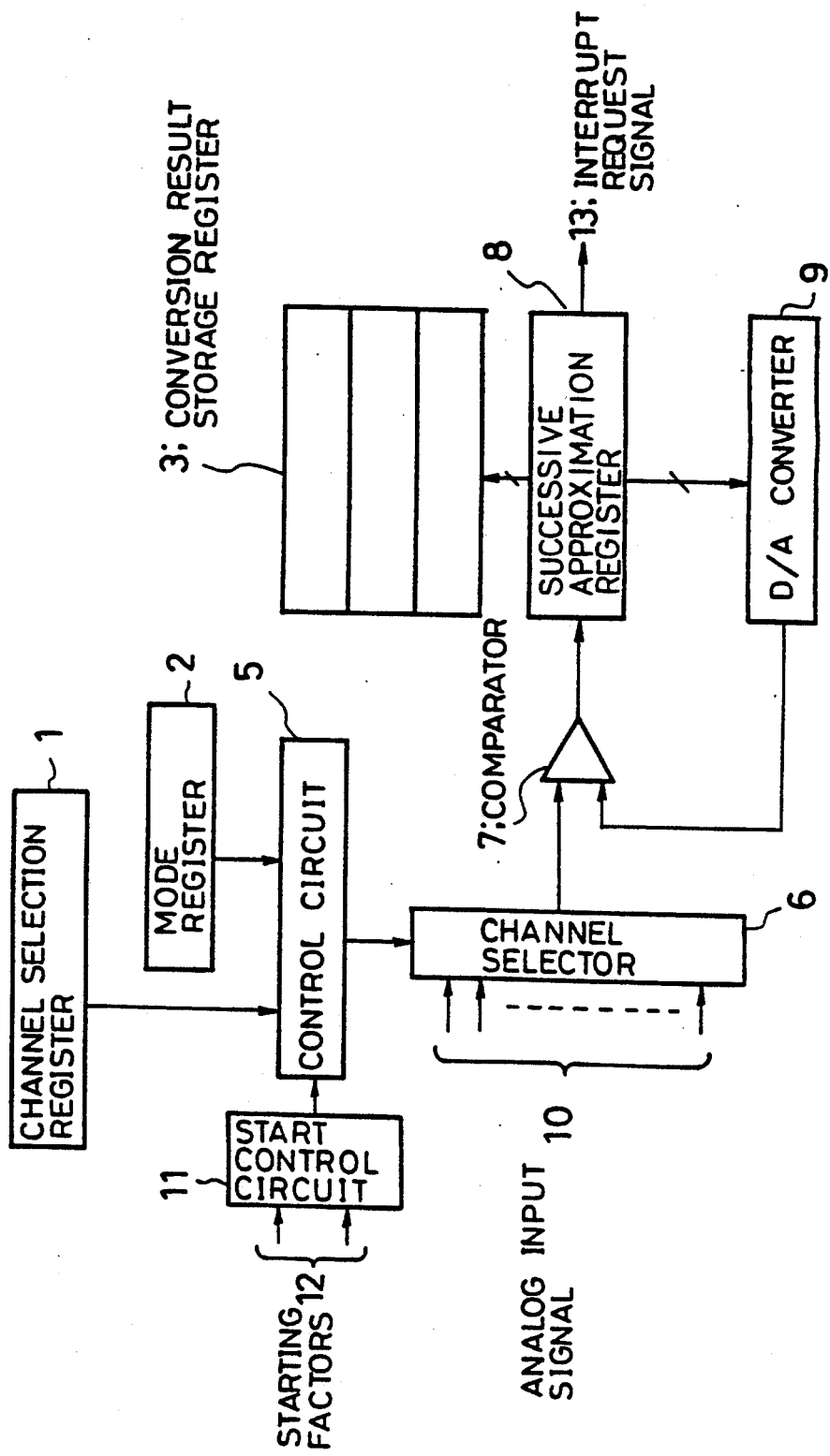
FIG. 9 is a block diagram of the configuration of a conventional A/D converter.

FIG. 1 is a block diagram of the configuration of an A/D converter according to a preferred embodiment of the present invention (claimed in claim 1). In the figure, elements corresponding to those shown in FIG. 9 are denoted by the same reference symbols, and their descriptions are omitted. In this embodiment, the same number of channel selection registers 1A and 1B, mode registers 2A and 2B, and conversion result storage registers 3A and 3B as the number of starting factors (two in this case) are provided, and divided into register groups according to the types of starting factors. That is, all of the above registers are divided into the first register group for the first starting factor consisting of the channel selection register 1A, the mode register 2A and the conversion result storage register 3A, and the second register group for the second starting factor consisting of the channel selection register 1B, the mode register 2B and the conversion result storage register 3B. Reference numeral 44 represents a register group selector having a plurality of selectors 4 for selecting these register groups. Numeral 51 represents a control circuit for specifying a register group for a certain starting factor when the factor is generated. In concrete terms, the circuit controls the channel selector 6 to switch analog input signal channels in response to an instruction from the channel selection register for the starting factor.

Figure 2:
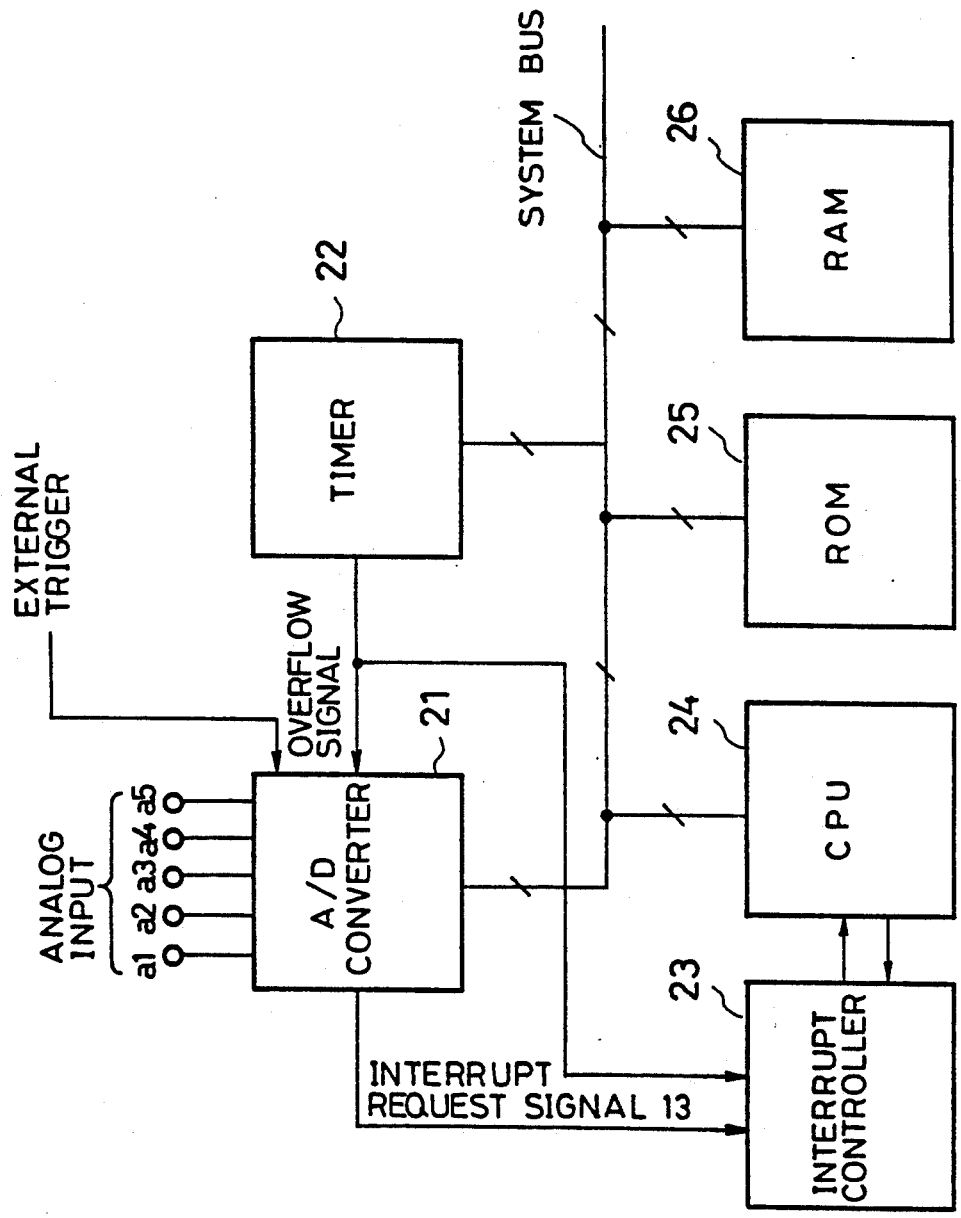
FIG. 2 is a block diagram of the configuration of a control system employing the A/D converter of the embodiment.

FIG. 2 is a block diagram of the configuration of a control system employing the A/D converter of the present invention. In the figure, numeral 21 represents the A/D converter shown in FIG. 1, 22 a timer for counting time, 23 an interrupt controller responsive to an interrupt request signal 13 such as a conversion complete signal to interrupt the CPU 24, 25 a ROM for storing data including programs for operating the CPU 24, and 26 a RAM for temporarily storing data required for the operation of the CPU 24.

Figures 3, 4:
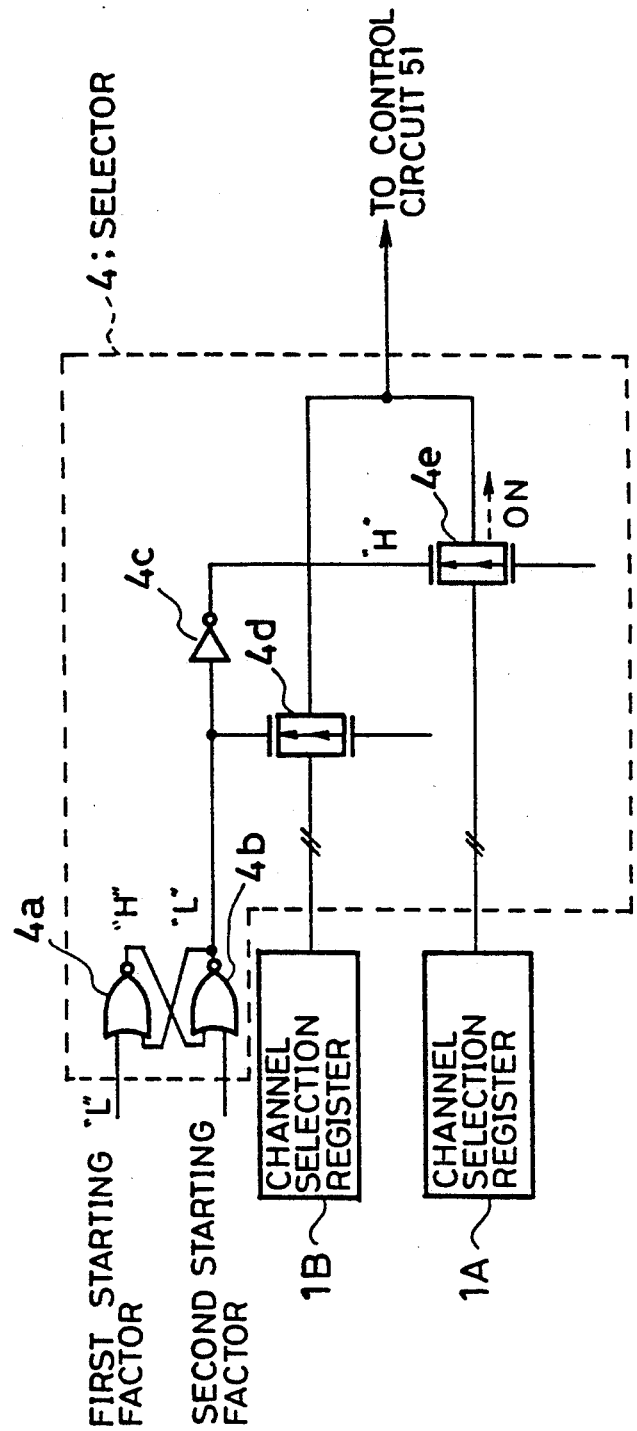
FIG. 3 is a diagram of the contents of the mode register shown in FIG. 1.
FIG. 4 is a circuit diagram of the selector provided in the register group selector shown in FIG. 1.

FIG. 3 is a diagram of the contents of the mode register shown in FIG. 1. The contents of this mode register include register group numbers for each starting factor, the number of groups corresponding to channels (which indicates how many times the same processing is repeated), and the number of repetitions which indicates how many times A/D conversion is repeated for a channel set according to group number and the number of groups.

FIG. 4 is a circuit diagram of the selector 4 provided in the register group selector 44 shown in FIG. 1. The selector 4 comprises a NOR gate 4a (first logic circuit) for receiving the first starting factor, a NOR gate 4b (second logic circuit) for receiving the second starting factor, a NOT gate 4c for inverting the output of this NOR gate 4b, a transfer gate 4d for supplying the output of the channel selection register 1B, and a transfer gate 4e for supplying the output of the channel selection register 1A.

In the figure, the first starting factor such as the output of the engine crank angle sensor is provided to the NOR gate 4a of the selector 4 as an external trigger, and the second starting factor such as the overflow output of a timer for providing timing to detect such data as the engine coolant temperature is provided to the NOR gate 4b of the selector 4. When a low-level external trigger is inputted into the NOR gate 4a, the output signal of the NOR gate 4b falls to a low level, and is inverted into a high-level signal by the inverter 4c, whereby the transfer gate 4e turned on, and the contents of the channel selection register 1A are supplied to the control circuit 51.

Next, the operation of this embodiment will be described with reference to FIG. 1 and FIG. 2. Take as an example a car engine control system which employs the A/D converter of the present invention. In this system, sampling is performed at predetermined intervals on the order of milliseconds for measurement items whose values do not change drastically, such as the engine coolant temperature. However, as for the accelerator, sampling must be performed for each injection. Therefore, a timer is used for A/D conversion of analog measurement data on the engine coolant temperature each time an overflow of the timer occurs, and an external trigger is used for A/D conversion of measurement data on the accelerator which requires real-time processing.

Conventionally, the CPU had to be used for the control of all of these processes. However, when the A/D converter of the present invention is used, the output of a sensor for detecting slow changes in coolant temperature, for example, is linked to analog inputs a1 to a3 shown in FIG. 2, and the output of a sensor for detecting changes in the accelerator is linked to an analog input a4. The external trigger indicative of the output of the engine crank angle sensor, for example, as the first starting factor and the overflow output of the timer 22 for providing timing to detect the engine coolant temperature as the second starting factor are linked to the start control circuit 11 in the A/D converter 21. The channel selection register 1A of the first register group for the first starting factor selects the analog input a4, and the mode register 1B selects a single conversion mode (A/D conversion of only the analog input signal of the analog input terminal a4). The channel selection register 1B of the second register group for the second starting factor selects the analog inputs a1 to a3, and the mode register 2B selects a scan mode (continuous A/D conversion of the analog inputs a1 to a3).

Figure 5A:
FIGS. 5(a) and 5(b) are timing charts for explaining the operation of this embodiment.
Figure 5B:
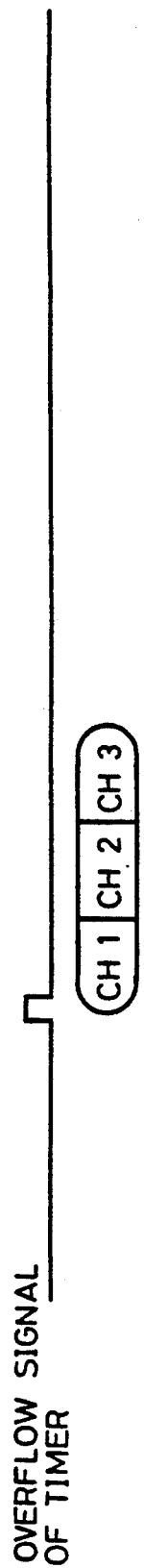

Also referring to the timing chart of FIG. 5(a)(b) the operation of the A/D converter will be described. CH1 to CH4 of FIG. 5(a)(b) indicate a period of time when A/D conversion of the analog inputs a1 to a4 corresponding to the first to fourth channels is performed. First, when an external trigger as the first starting factor is inputted into the start control circuit 51, the first register group is selected by the control of the control circuit 51 and the register group selector 44. Then, A/D conversion of the analog input a4 corresponding to the fourth channel is performed by the comparator, and the result of conversion is stored in the conversion result storage register 3A upon completion of conversion.

Next, when the overflow output of the timer 22 is generated as the second starting factor, the second register group is selected by the control of the control circuit 51 and the register group selector 44. Thereafter, A/D conversion of the first to third channels, that is, the analog inputs a1 to a3, is performed sequentially according to the contents of the mode register 1B, and the results of conversions are stored in the conversion result storage register 3B. In this way, the duplication of the conversion result storage register eliminates a problem caused when A/D conversion of the analog inputs a1 to a3 corresponding to the first to third channels begins before the CPU 24 reads out the result of A/D conversion of the analog input a4 corresponding to the fourth channel.

Then, an external trigger is inputted again as the first starting factor. The register group is switched from the second register group to the first register group to start A/D conversion of the analog input a4 corresponding the fourth channel.

Embodiment 2

Figure 6:
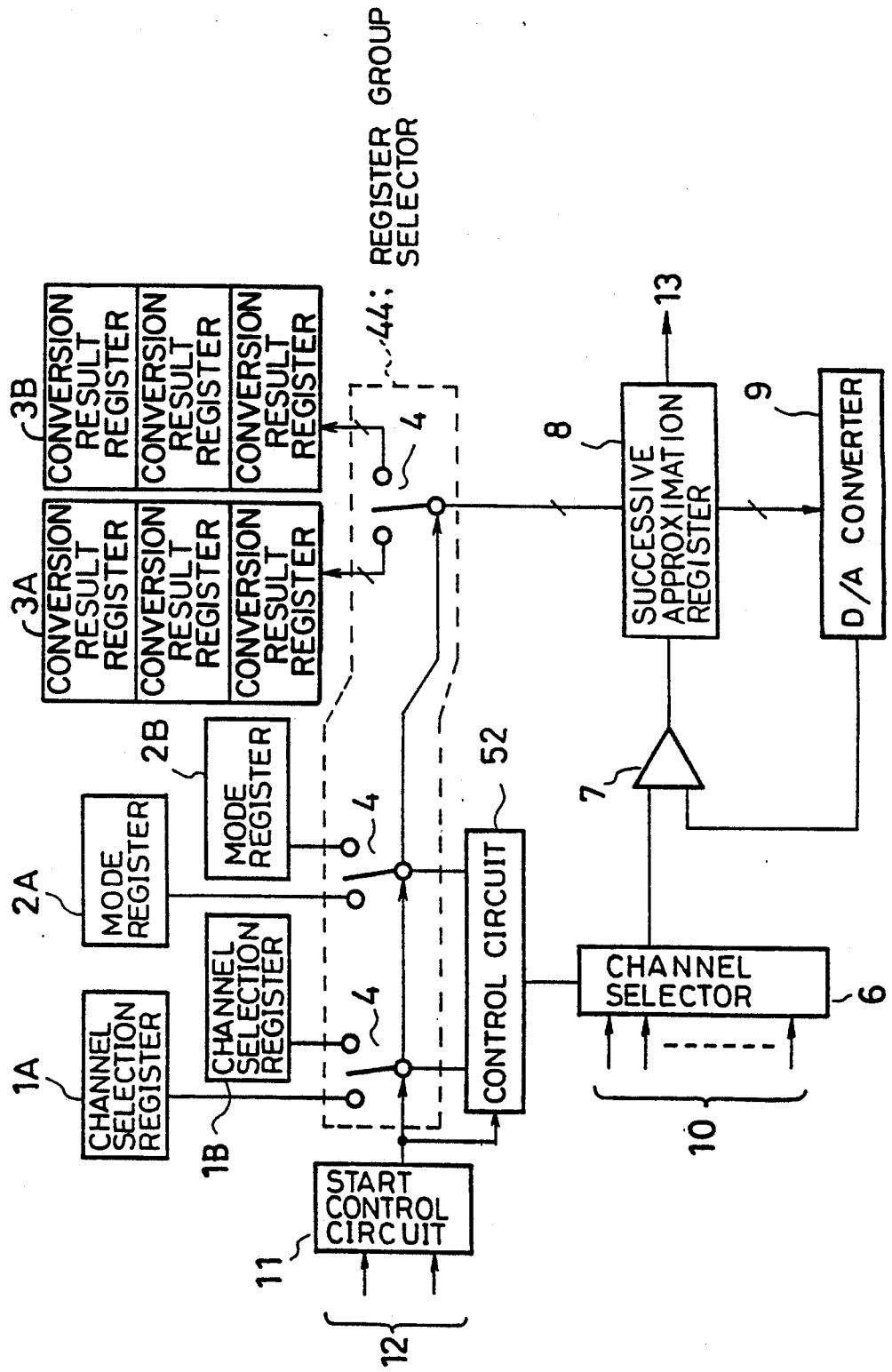
FIG. 6 is a block diagram of the configuration of an A/D converter according to another embodiment of the present invention.

In the above-mentioned Embodiment 1, the external trigger and the time overflow output do not overlap. In fact, however, there is a case when the external trigger is inputted during A/D conversion of the analog inputs a1 to a3 corresponding to the first to third channels. In this case, priority is given to either one of them so that A/D conversion of the one having a higher priority level is performed first, and then A/D conversion of the other is performed or resumed. A block diagram of the configuration of an A/D converter comprising a control circuit for performing such control is shown in FIG. 6.

In the figure, elements corresponding to those shown in FIG. 1 are denoted by the same reference symbols, and their descriptions are omitted. In the figure, the control circuit 52 according to the invention claimed in claim 3 determines the weight of a given starting factor, and controls the register group selector 44 for selecting a register group according to the result of this decision. The control circuit 52 gives priority to A/D conversion in response to an external trigger, for instance, when the external trigger indicative of the output of an engine crank angle sensor which requires real-time processing (the first starting factor) and the overflow output of the timer for providing timing to detect the engine coolant temperature (the second starting factor) are inputted at the same time, or when the external trigger is inputted during A/D conversion in response to the overflow output.

Figure 7:
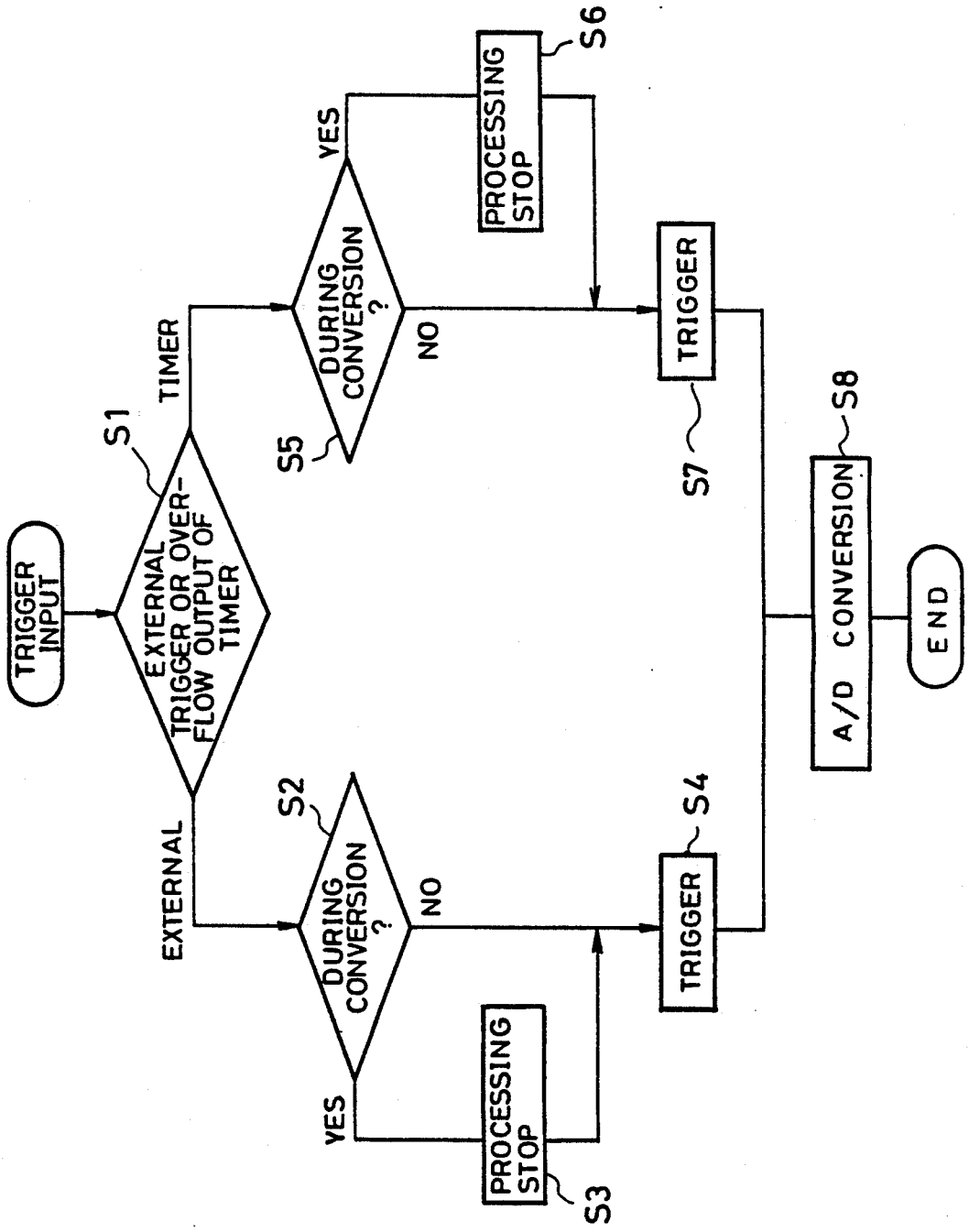
FIG. 7 is a flow chart for explaining the operation of the control circuit shown in FIG. 6.

The characteristic operation of this control circuit 52 will be described with reference to the flowchart of FIG. 7. The control circuit 52 checks whether an input signal is an external trigger or the overflow output of the timer (step S1). When the input signal is the external trigger, the control circuit 52 checks whether A/D conversion in response to another starting factor (the overflow output of the timer in this case) is being performed or not (step S2). When the A/D conversion is being performed, the control circuit 52 stops the conversion (step S3), and when it is not being performed, the circuit enables the register group selector 44 to select a register group for the external trigger, that is, the first starting factor so that A/D conversion is performed by the comparator using the selected register group (step S8).

On the other hand, when the input signal is the overflow output of the timer (step S1), the step goes to S5, and the control circuit 52 checks whether A/D conversion in response to the overflow output of the timer is being performed or not. When A/D conversion in response to the overflow output of the timer is being performed, and an external trigger is inputted at this time, the control circuit 52 stops the conversion (step S6), and enables the register group selector 44 to select a register group for the external trigger for A/D conversion (step S8).

In this way, when an external trigger and the overflow output of the timer are inputted into the control circuit 52 at the same time, or when an external trigger is inputted during A/D conversion in response to the overflow output of the timer, the control circuit 52 gives priority to A/D conversion in response to the external trigger.

Embodiment 3

In the above-mentioned Embodiments 1 and 2 where the number of interrupt request signals outputted from the A/D converter is only one, it is impossible to distinguish the completion of A/D conversion in response to the first starting factor from the completion of A/D conversion in response to the second starting factor. In other words, a starting factor requires real-time processing, but the other does not. However, it is impossible to distinguish these starting factors with a single interrupt output.

Figure 8:
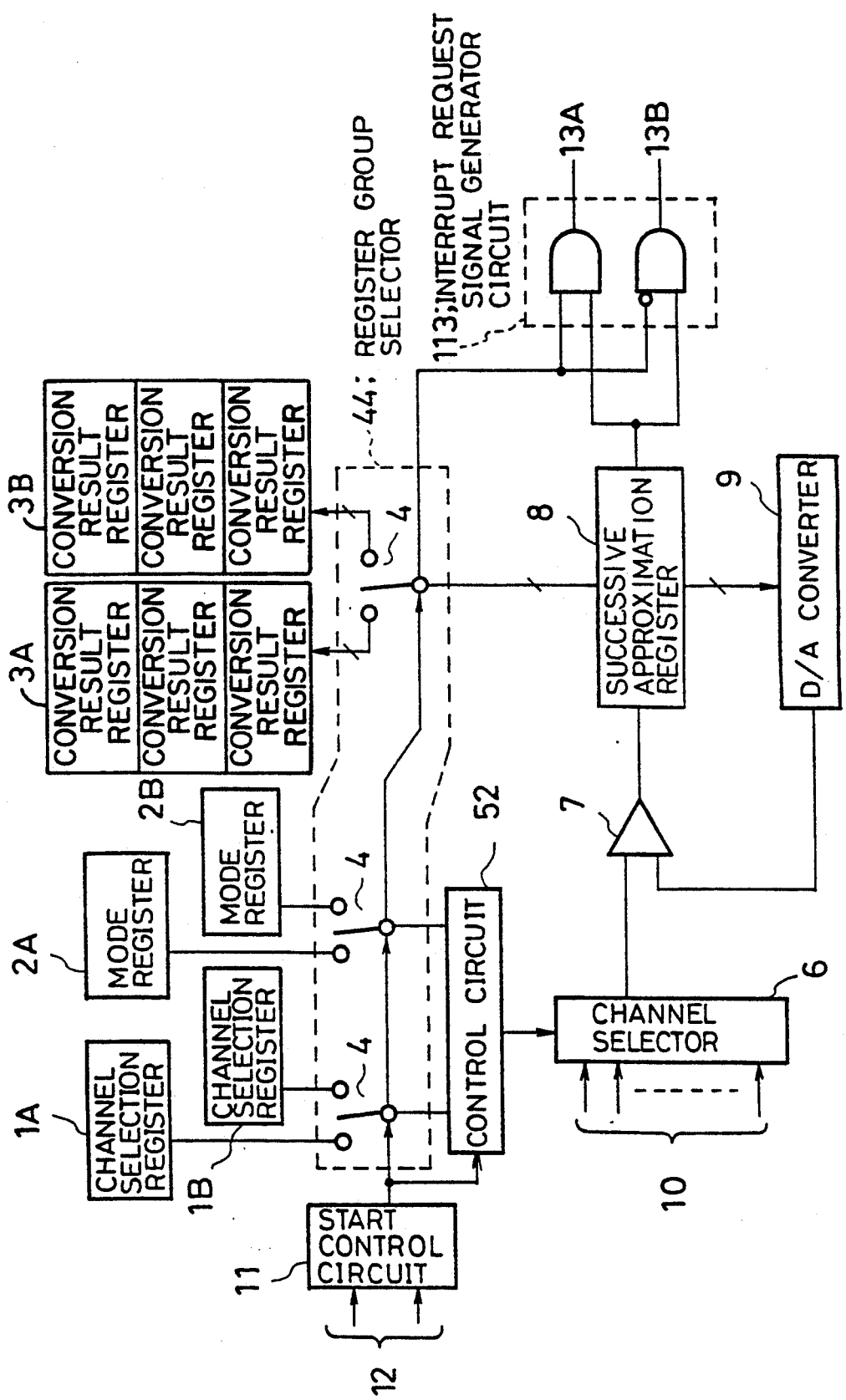
FIG. 8 is a block diagram of an A/D converter according to another embodiment of the present invention.

To solve this problem, an interrupt request signal generator circuit 113 (embodiment of the present invention claimed in claim 2) having AND gates (logic circuits) which are controlled based on the comparison result of the comparator as shown in FIG. 8 is provided in Embodiment 3 to distinguish interrupt request signals. 13A of FIG. 8 represents a first interrupt request signal indicative of the completion of A/D conversion in response to the first starting factor, and 13B a second interrupt request signal indicative of the completion of A/D conversion in response to the second starting factor.

In the above embodiments, there are two starting factors. There should be at least two starting factors, but there is no upper limit. It is to be understood that types of A/D conversion modes and the number of registers are only examples and not limited to those of these embodiments. Furthermore, the channel selection register and the mode register are provided as a separate unit, but the mode register may be provided with a channel selection function as a single unit.

As described above, according to the present invention, register groups are provided for each starting factor, and when a starting factor is generated, a register group for the factor is specified so that a plurality of starting factors can be accepted without the use of the CPU, resulting in improved real-time processing speed of A/D conversion.

Since an interrupt request signal indicative of the completion of A/D conversion is generated for each starting factor, the interrupt request signal can be identified, thus making it possible to improve the interrupt control performance of the CPU and the processing speed of the control system.

Since the weight of each starting factor is determined and a register group is selected according to the result of this decision, A/D conversion in response to a starting factor requiring real-time processing is performed first, with the result of further improved real-time processing speed of A/D conversion.

What is claimed is:

1. An A/D converter comprising a channel selector for selecting one of a plurality of channels having analog input signals, a comparator for comparing the voltage of the analog input signal of a channel selected by said channel selector and a sequentially changing reference voltage, a conversion result storage register for storing the comparison result of said comparator as the result of A/D conversion, a channel selection register for storing channel selection information for said channel selector to select one of the channels, and a mode register for storing mode information such as starting factors, A/D conversion speed and A/D conversion operation modes, wherein, when there are a plurality of starting factors, the same number of said channel selection registers, mode registers and conversion result storage registers as the number of said starting factors are provided and divided into groups, according to the types of said starting factors, each consisting of a channel selection register, a mode register and a conversion result storage register; and a control circuit for specifying a register group for a starting factor when the factor is generated is also provided.

2. An A/D converter comprising a channel selector for selecting one of a plurality of channels having analog input signals, a comparator for comparing the voltage of the analog input signal of a channel selected by said channel selector and a sequentially changing reference voltage, a conversion result storage register for storing the comparison result of said comparator as the result of A/D conversion, a channel selection register for storing channel selection information for said channel selector to select one of the channels, and a mode register for storing mode information such as starting factors, A/D conversion speed and A/D conversion operation modes, wherein, when there are a plurality of starting factors, the same number of said channel selection registers, mode registers and conversion result storage registers as the number of said starting factors are provided and divided into groups, according to the types of said starting factors, each consisting of a channel selection register, a mode register and a conversion result storage register; and a control circuit for specifying a register group for a starting factor when the factor is generated and an interrupt request signal generator circuit for generating an interrupt request signal indicative of the completion of A/D conversion for each starting factor are also provided.

3. An A/D converter according to claim 2, wherein said interrupt request signal generator circuit comprises logic circuits for identifying interrupt request signals based on the comparison result of said comparator.

4. An A/D converter comprising a channel selector for selecting one of a plurality of channels having analog input signals, a comparator for comparing the voltage of the analog input signal of a channel selected by said channel selector and a sequentially changing reference voltage, a conversion result storage register for storing the comparison result of said comparator as the result of A/D conversion, a channel selection register for storing channel selection information for said channel selector to select one of the channels, and a mode register for storing mode information such as starting factors, A/D conversion speed and A/D conversion operation modes, wherein, when there are a plurality of starting factors, the same number of said channel selection registers, mode registers and conversion result storage registers as the number of said starting factors are provided and divided into groups, according to the types of said starting factors, each consisting of a channel selection register, a mode register and a conversion result storage register; and a control circuit for specifying a register group for a starting factor when the factor is generated determines the weight of a given starting factor and controls said register group selector for selecting a register group according to the result of this decision.

5. An A/D converter according to claim 4, wherein a selector provided in said register group selector consists of a plurality of logic circuits for accepting a plurality of starting factors and a plurality of transfer gates controlled by the outputs of these logic circuits for providing the output of said channel selection register to said control circuit.

6. An A/D converter according to claim 1 or 2, wherein
said control circuit controls said channel selector to switch analog input signal channels according to an instruction from said channel selection register for a starting factor.

7. An A/D converter according to claim 1, 2, or 4, wherein said mode register stores such information as register group numbers for each starting factor, the number of groups corresponding to channels, the number of repetitions indicating how many times A/D conversion is repeated for a channel set according to group number and the number of groups.

8. An A/D converter according to claim 1, 2 or 4, wherein
a first starting factor of a plurality of starting factors is the output of an engine crank angle sensor, and a second starting factor is the overflow output of a timer for providing timing to detect information such as the engine coolant temperature.

* * * * *